United States Patent [19]
Shiraishi

[11] Patent Number: 6,020,950
[45] Date of Patent: Feb. 1, 2000

[54] EXPOSURE METHOD AND PROJECTION EXPOSURE APPARATUS

[75] Inventor: Naomasa Shiraishi, Kawasaki, Japan

[73] Assignee: Nikon Corporation, Tokyo, Japan

[21] Appl. No.: 09/131,670

[22] Filed: Aug. 10, 1998

Related U.S. Application Data

[63] Continuation of application No. 08/969,124, Nov. 12, 1997, abandoned, which is a continuation of application No. 08/436,597, May 8, 1995, abandoned, which is a continuation of application No. 08/270,320, Jul. 5, 1994, abandoned, which is a continuation of application No. 08/020,800, Feb. 22, 1993, abandoned.

[30] Foreign Application Priority Data

Feb. 24, 1992 [JP] Japan ...................................... 4-36347
Feb. 24, 1992 [JP] Japan ...................................... 4-36348

[51] Int. Cl.[7] .......................... G03B 27/52; G03B 27/42; G03B 27/54
[52] U.S. Cl. .................................. 355/30; 355/53; 355/67
[58] Field of Search .................................. 355/50, 53, 55, 355/30, 67, 77; 359/559–564; 356/400, 401; 250/548

[56] References Cited

U.S. PATENT DOCUMENTS

| | | | |
|---|---|---|---|
| 4,258,265 | 3/1981 | Sumi ..................................... | 250/492.2 |
| 4,890,309 | 12/1989 | Smith et al. ............................... | 378/35 |
| 4,937,619 | 6/1990 | Fukuda et al. ............................. | 355/53 |
| 4,947,413 | 8/1990 | Jewell et al. ............................. | 359/563 |
| 5,168,302 | 12/1992 | Watanuki ................................... | 355/30 |
| 5,255,050 | 10/1993 | Kitagawa ................................... | 355/53 |
| 5,276,551 | 1/1994 | Nakagawa ................................. | 359/571 |
| 5,300,971 | 4/1994 | Kudo ........................................ | 355/67 |
| 5,316,896 | 5/1994 | Fukuda et al. ............................. | 430/5 |
| 5,348,837 | 9/1994 | Fukuda et al. ............................. | 355/53 |
| 5,436,114 | 7/1995 | Itoo et al. ................................. | 355/53 |
| 5,552,856 | 9/1996 | Shiraishi .................................. | 355/53 |

FOREIGN PATENT DOCUMENTS

| | | |
|---|---|---|
| 62-50811 | 4/1982 | Japan . |
| 2-166717 | 6/1990 | Japan . |
| 4-162039 | 8/1992 | Japan . |
| 4-223464 | 8/1992 | Japan . |

OTHER PUBLICATIONS

H. Fukuda et al, "Enhancement of Focal Depth by Spatial Filtering in Optical Lithography (I)", Japanese Society of Applied Physics, Lecture 29a–ZC–8, 1991.
H. Fukuda et al, "Enhancement of Focal Depth by Spatial Filtering in Opitcal Lithography (II)", Japanese Society of Applied Physics, Lecture 29a–ZC–9, 1991.
N. Hasegawa et al, "Submicron Photolithography Using Phase Shifting Mask (9)—Halftone Phase Shifting Mask–", Japan Society of Applied Physics, Lecture 29p–ZC–3, 199.

*Primary Examiner*—Alan A. Mathews
*Assistant Examiner*—Hung Henry Nguyen
*Attorney, Agent, or Firm*—Vorys, Sater, Seymour and Pease LLP

[57] ABSTRACT

In an exposure method of imaging/projecting, through a projection optical system, a pattern formed on a mask onto an object to be exposed, a mask is placed on an object plane side of the projection optical system, the pattern formed on the mask being constituted by a transparent portion which is almost transparent to exposure light, and a phase shift portion for producing light whose phase is shifted from that of light transmitted through the transparent portion by almost an odd number multiple of $\pi$, and the object is exposed while a limiting member for limiting a beam, of beams passing through a Fourier transform plane having an optical Fourier transform relationship with a pattern surface of the mask in the projection optical system, which propagates near an optical axis of the projection optical system is placed at or near the Fourier transform plane.

55 Claims, 9 Drawing Sheets

EXPOSURE METHOD AND PROJECTION EXPOSURE APPARATUS

CROSS-REFERENCE TO RELATED APPLICATIONS

This application is a continuation of application Ser. No. 08/969,124 filed Nov. 12, 1997, which is a continuation of application Ser. No. 08/436,597 filed May 8, 1995, which is a continuation of application Ser. No. 08/270,320 filed Jul. 5, 1994, which is a continuation of application Ser. No. 08/020,800 filed Feb. 22, 1993 (all now abandoned).

BACKGROUND OF THE INVENTION

1. Field of the Invention

The present invention relates to a fine pattern exposure transfer technique required for the manufacture of semiconductor integrated circuits, liquid crystal displays, and the like and, more particularly, to an exposure method and a projection exposure apparatus, both using a projection optical system.

2. Related Background Art

Fine patterns such as semiconductor circuit patterns are formed by a method called photolithography. Especially, a reduction projection method is most widely used at the present time. In this method, an enlarged pattern formed on an original plate (reticle) is reduced in size by a projection optical system, and the reduced pattern is transferred onto an object to be exposed (e.g., a wafer). In this case, a photosensitive film (photoresist) is coated on the wafer surface to a thickness of about 1 $\mu$m. The photoresist is sensitized in accordance with the contrast of a projection image of the reticle pattern. When the photoresist is developed, provided that the resist is of a positive type, portions (bright portions) of the resist, which are irradiated with light, are dissolved and removed, and portions (dark portions) of the resist, which are not irradiated with light, are left without being dissolved. In contrast to this, if the resist is of a negative type, bright portions are left, and dark portions are dissolved. In the current techniques, a positive photoresist is superior in resolution, stability, and the like to a negative photoresist. For this reason, in most cases, a positive photoresist is used in general wafer lithography.

The resolution (the minimum size of a pattern which can be transferred) in a conventional projection exposure method is represented by k·$\lambda$/NA. An improvement in resolution has been achieved by decreasing $\lambda$ (exposure wavelength) and increasing an NA (the numerical aperture of a projection optical system). Recently, a phase-shifting method (e.g., Japanese Patent Publication No. 62-50811) and a multiple imaging amplification synthesizing method (i.e., the Super FLEX method disclosed at Spring Convention of the Japan Society of Applied Physics, lecture 29a-ZC-8, 9 (1991)) have been proposed, in which methods of improving the resolution without changing the numerical aperture NA and the wavelength $\lambda$ have been studied.

The phase-shifting method is an exposure method using a so-called phase shift reticle on which a desired pattern is formed by using a transparent portion which transmits light almost completely, and a phase shift transparent portion which shifts the phase of light transmitted through the transparent portion by about $\pi$ [rad] or an odd number multiple thereof. That is, in this method, an improvement in resolution is achieved by using a light amplification cancellation effect $((+1)+(-1)=0)$ between light transmitted through a normal transparent portion (phase=0, amplification=exp(i×0)=+1) and light transmitted through a phase shift transparent portion (phase=$\pi$, amplification=exp(i$\pi$)=−1).

In the multiple imaging amplification synthesizing method, a light-absorbing member having a high transmittance near the optical axis and a low transmittance at the peripheral portion is arranged at a Fourier transform corresponding plane (to be referred to as a pupil plane hereinafter) in a projection optical system with respect to a reticle pattern. With this arrangement, the reticle pattern is exposed. The multiple imaging amplification synthesizing method is advantageous especially to a hole pattern (fine hole pattern) or an island pattern (fine remaining pattern).

Furthermore, a multiple imaging method has been proposed, in which one region on a wafer is sequentially exposed a plurality of times. In this method, the wafer is shifted little by little in the direction of the optical axis of a projection optical system in units of exposure operations, thus performing multiple imaging of even a defocused pattern image. The method allows an increase in focal tolerance (focal depth) especially when a hole pattern is to be formed in a positive photoresist.

When a conventional reticle pattern constituted by a complete light-shielding portion (chromium layer) and a complete transparent portion is to be exposed by using a projection optical system having no light-absorbing or light-shielding member at the pupil plane, the focal tolerance (focal depth) of a projection image is substantially determined by ±$\lambda$/2NA$^2$. Therefore, if the exposure wavelength $\lambda$ is decreased and the numerical aperture NA is increased in order to improve the resolution, the focal depth is inevitably decreased. However, there are projections having a height of about 1 $\mu$m on an actual semiconductor integrated circuit surface (the surface of one irradiated region on a wafer). Furthermore, in consideration of the optical thickness (actual thickness divided by the refractive index ≅0.5 $\mu$m) of a photosensitive material (photoresist) for pattern transfer, a focal depth of almost 1.5 $\mu$m or more is required to perform accurate pattern transfer.

In a projection optical system most widely used currently, since the exposure wavelength $\lambda$ is set to be 0.365 $\mu$m, and the numerical aperture NA is about 0.5, the focal depth is ±0.365/2×0.5$^2$=±0.73 $\mu$m. This value is equivalent to 1.46 $\mu$m in width. It is apparent that the focal depth is insufficient in the existing condition. Therefore, the method of improving the resolution by decreasing the exposure wavelength $\lambda$ and increasing the numerical aperture NA is not practical because it sacrifices the focal depth.

Although the phase-shifting method allows an increase in focal depth as well as an improvement in resolution, it is difficult to apply the method especially to a hole pattern (a pattern for forming fine holes in part of a photoresist). This is because, provided that a high-performance positive resist such as the one described above is used, a transparent portion (hole pattern) is formed on a light-shielding portion (chromium layer) as an underlying layer constituting a reticle, and a phase shift transparent portion must be formed on a transparent portion surrounding the hole pattern. In addition, it is very difficult to manufacture a reticle pattern. This is because a total of two patterning operations are required, i.e., a patterning operation for forming light-shielding and transparent portions (patterning by etching a chromium layer), and a patterning operation for forming transparent and phase shift transparent portions (patterning by etching a shifter layer), and positioning is required between the two patterning operations.

These patterning operations are generally performed by an electron beam exposure unit (EB exposure unit). Pattern data to be processed by the EB exposure unit is constituted by drawing data for patterning of transparent and light-shielding portions and drawing data of patterning of transparent and phase shift transparent portions. That is, an enormous amount of data must be processed by the unit.

In contrast to this, if a negative resist is to be applied to the formation of a hole pattern, a phase shift reticle (e.g., a shifter light-shielding type) is easy to manufacture. More specifically, such a phase shift reticle can be manufactured by forming a hole pattern of a phase shift transparent portion on a transparent portion (bare glass surface portion) as an underlying layer. This manufacturing process requires only one patterning operation. However, as described above, since a negative photoresist is inferior to a positive photoresist in performance, and the above-described multiple imaging method cannot be used together, a satisfactory effect cannot be obtained upon exposure.

In the multiple imaging amplification synthesizing method using a projection optical system having a light-absorbing member formed at the pupil plane, both the resolution and the focal depth can be increased with respect to a hole pattern, and a positive photoresist can be used. However, the transmittance of a light-absorbing member at the pupil plane must be continuously and concentrically changed from the optical axis. Such a light-absorbing member is difficult to manufacture. In addition, the light-absorbing member generates or accumulates heat upon absorption of light. This heat is transferred to other members of the projection optical system to cause thermal deformation and a change in refractive index, resulting in a deterioration in imaging performance. Note that if a desired effect is to be obtained, the amount of light absorbed by the light-absorbing member arranged at the pupil plane reaches about 80% of the amount of light incident on the projection optical system.

Furthermore, a so-called halftone type phase shift reticle has been proposed as a phase shift reticle suitable especially for exposure/transfer of a hole pattern (Spring Convention of the Japan Society of Applied Physics lecture 29p-ZC-3 (199)). A halftone type phase shift reticle is a reticle having an underlying layer (halftone) whose phase is shifted by $\pi$ and which has a light absorption property (or reflection property) of a predetermined amount, and a fine transparent pattern (whose phase is not shifted) formed with respect to the underlying layer. Therefore, a fine hole pattern (a bright pattern for a positive resist) is formed by interference between the respective beams of light transmitted through the fine transparent portion and the remaining halftone portion. With this reticle, the resolution and focal depth of the hole pattern in exposure and transfer can be increased. Although the halftone type phase shift reticle is completed by one patterning operation and can be easily manufactured, light transmitted through the halftone portion leaks to a dark portion (non-pattern portion), resulting in a deterioration in the contrast of a projection image. In addition, the above-described multiple imaging method is difficult to use with this reticle because of this leakage light to the dark portion.

The above description is associated especially with the formation of a hole pattern. This is because a hole pattern among various types of patterns treated in a wafer lithographic process is most difficult to form. Therefore, if a hole pattern can be reduced in size, the overall integrated circuit can be easily reduced in size accordingly.

SUMMARY OF THE INVENTION

It is an object of the present invention to provide an exposure method and a projection exposure apparatus, which allows the use of a positive photoresist as an object to be exposed when a hole pattern is formed by using a phase shift reticle.

In order to achieve the above object, according to the present invention, in the first exposure method, a mask (reticle R1) having a pattern constituted by a transparent portion ($a_1$) which is almost transparent to exposure light (IL), and a phase shift portion ($b_1$) for producing light whose phase is shifted from that of light transmitted through the transparent portion by almost an odd number multiple of $\pi$ is placed on the object plane side of a projection optical system (PL), and an object (W) placed on the image plane side of the projection optical system is exposed while a limiting member (light-shielding plate FL) for limiting a beam, of beams passing through a plane (EP) having an optical Fourier transform relationship with the pattern surface of the mask in the projection optical system, which propagates near the optical axis (AX) of the projection optical system is placed at or near the Fourier transform plane (EP).

In addition, according to the present invention, the first projection exposure apparatus includes a projection optical system (PL) for imaging/projecting a pattern formed on a mask (reticle R1) onto an object (W) to be exposed, the pattern of the mask being constituted by a transparent portion ($a_1$) which is almost transparent to exposure light (IL), and a phase shift portion ($b_1$) for producing light whose phase is shifted from that of light transmitted through the transparent portion by almost an odd number multiple of $\pi$, and a limiting member (FL) for limiting a beam, of beams passing through a plane (EP) having an optical Fourier transform relationship with the pattern surface of the mask in the projection optical system, which propagates near the optical axis (AX) of the projection optical system is arranged at or near the Fourier transform plane (EP).

The first exposure method and projection exposure apparatus of the present invention are based on the assumption that a so-called shifter light-shielding type phase shift reticle (all shifter reticle) is used, which has only a phase shift portion formed in a glass substrate (e.g., a quartz substrate) as an underlying layer by patterning. When a wafer is exposed upon mounting the shifter light-shielding type phase shift reticle in a general projection exposure apparatus, an image of a boundary portion between the phase shift portion and the underlying transparent portion is transferred, as a dark image, on the wafer. If the planar size of the phase shift portion is smaller than a given size, an image of the phase shift portion itself is transferred, as a dark image, onto the wafer. This phenomenon will be described in detail later. Such a dark image is formed because the boundary portion or the fine phase shift portion corresponds to a point at which the phase difference between beams transmitted through the underlying transparent portion and the phase shift portion changes from 0 to $\pi$.

In contrast to this, if a beam, of beams passing through the Fourier transform plane (pupil plane) with respect to the reticle pattern in the projection optical system, which propagates near the optical axis is shielded (or absorbed), an image of the boundary portion of the fine phase shift portion, which has been transferred as a dark image, is transferred as a bright image, and the remaining portion (which has been a bright portion) becomes a dark image. This is because the spatial frequency of the pattern at the boundary portion between the transparent and phase shift portions is high so that diffracted light produced by the reticle pattern passes through the pupil plane at a position spaced apart from the optical axis without being shielded by the light-shielding plate and reaches the wafer, thereby generating a bright image. In contrast to this, since the spatial frequency of the transparent portion itself as the underlying layer is low, the diffracted light passes through the pupil plane of the projection optical system at a position near the optical axis. Therefore, the light is shielded by the light-shielding plate and cannot reach the wafer.

As described above, according to the first exposure method and projection exposure apparatus of the present invention, fine hole pattern formation which allows the use of a positive photoresist can be realized by using a combination of a phase shift reticle (all shifter reticle), which is easy to manufacture, and a projection optical system. In addition, a greater focal depth can be obtained by moving an object to be exposed in the direction of the optical axis of the projection optical system during exposure. Furthermore, if the projection optical system includes a means for cooling a limiting member arranged therein, the system is free from heat generation caused by light absorption.

In addition, in the second exposure method according to the present invention, a mask (reticle R2) having a pattern constituted by a transparent portion ($b_2$) which is almost transparent to exposure light (IL), and a phase shift portion ($a_2$), having a predetermined transmittance (e.g., 5 to 30%), for producing light whose phase is shifted from that of light transmitted through the transparent portion by almost an odd number multiple of $\pi$ is placed on the object plane side of a projection optical system (PL), and the object (W) placed on the image plane side of the projection optical system is exposed while a limiting member (light-shielding plate FL) for limiting a beam, of beams passing through a plane (EP) having an optical Fourier transform relationship with the pattern surface of the mask in the projection optical system, which propagates near the optical axis (AX) of the projection optical system is placed at or near the Fourier transform plane (EP).

Furthermore, the second projection exposure apparatus according to the present invention includes a projection optical system (PL) for imaging/projecting an image of a pattern formed on a mask (reticle R2) onto an object (W) to be exposed, the mask pattern being constituted by a transparent portion ($b_2$) which is almost transparent to exposure light (IL), and a phase shift portion ($a_2$), having a predetermined transmittance (e.g., 5 to 30%), for producing light whose phase is shifted from that of light transmitted through the transparent portion by almost an odd number multiple of $\pi$, and a limiting member (FL) for limiting a beam, of beams passing through a plane (EP) having an optical Fourier transform relationship with a pattern surface of the mask in the projection optical system, which propagates near an optical axis (AX) of the projection optical system is arranged at or near the Fourier transform plane (EP).

The reticle (halftone type phase shift reticle) used in the second exposure method and projection exposure apparatus of the present invention is designed such that a very dark portion (owing to a cancellation effect of light) is formed at a boundary portion between a transparent portion and a phase shift portion (transmittance of 5 to 30%), and an image of the transparent portion itself is transferred as a bright image. In addition, owing to the above-mentioned cancellation effect, the width of this bright image can be reduced more than that of an image obtained by using a conventional complete transparent/complete light-shielding type reticle (a conventional reticle). In this case, if an object (wafer) to be exposed is exposed upon mounting the halftone type phase shift reticle in a general projection exposure apparatus, transmitted light (leakage light) from the phase shift portion also reaches the wafer.

In the second exposure method and projection exposure apparatus, however, the limiting member (light-shielding plate) for shielding or absorbing only a beam passing near the optical axis is arranged at the Fourier transform plane (pupil plane) with respect to the reticle pattern in the projection optical system, thereby preventing the leakage light from reaching the wafer. Such an arrangement is employed for the following reasons. The spatial frequency of a pattern at a fine transparent portion or a boundary portion between transparent and phase shift portions is so high that diffracted light produced by the reticle pattern passes through the pupil plane at a position spaced apart from the optical axis without being shielded by the light-shielding plate and reaches the wafer, thereby generating a bright image. In contrast to this, since the spatial frequency of the phase shift portion itself as the underlying layer is low, the diffracted light passes through the pupil plane of the projection optical system at a position near the optical axis. Therefore, the light is shielded by the light-shielding plate and cannot reach the wafer.

As described above, according to the second exposure method and projection exposure apparatus of the present invention, fine hole pattern formation which allows the use of a positive photoresist can be realized by using a combination of a phase shift reticle (halftone type phase shift reticle), which is easy to manufacture, and a projection optical system. In addition, a greater focal depth can be obtained by moving an object to be exposed in the direction of the optical axis of the projection optical system during exposure. Furthermore, if the projection optical system includes a means for cooling a limiting member arranged therein, the system is free from heat generation caused by light absorption.

DESCRIPTION OF THE PREFERRED EMBODIMENTS

Figure 2A:
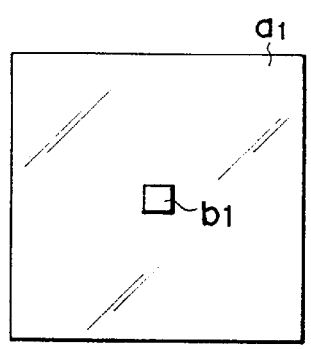
FIG. 2A is a plan view showing the structure of a reticle pattern used in the first embodiment.

FIG. 2A shows a pattern of a reticle R1 used in the first embodiment of the present invention. This reticle has the same arrangement as that of a phase shift reticle (all shifter reticle) used for hole pattern formation based on the above-described negative resist. That is, a phase shift transparent portion $b_1$ such as a thin dielectric film (e.g., SOG) serving as a hole pattern is formed in an underlying transparent portion $a_1$, of a transparent substrate (e.g., a quartz substrate) to have a thickness which gives a phase difference $\pi$ to transmitted light. Assume that the phase shift transparent portion $b_1$ has a very small size.

Figure 2B:
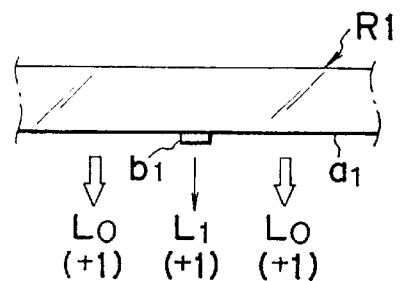
FIG. 2B is a sectional view of the reticle pattern in FIG. 2A.

FIG. 2B is a sectional view of the reticle pattern in FIG. 2A. If the amplification of light $L_0$ transmitted through the underlying transparent portion $a_1$ is +1, the sign of the amplification of light $L_1$ transmitted through the phase shift transparent portion $b_1$ is negative. Note that the transmittances of the phase shift transparent portion $b_1$ and the underlying transparent portion $a_1$ are almost equal.

Figure 2C:
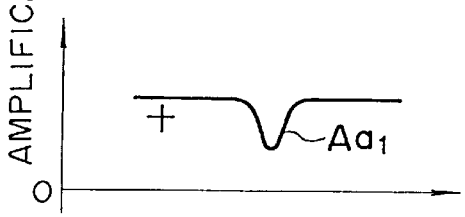
FIGS. 2C to 2F are charts, each showing the amplification or intensity characteristics of a projection image in a case wherein the reticle pattern in FIG. 2A is mounted on a conventional projection exposure apparatus.
Figure 2D:
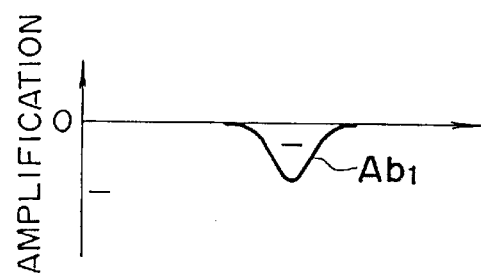

If the projection optical system has a general arrangement (including no light-shielding member and the like used in the present invention), a projection image of the underlying transparent portion $a_1$ has an amplification distribution $Aa_1$ (shown in FIG. 2C) on a wafer. Note that the curve of the amplification distribution $Aa_1$ is slightly moderated depending on the type of a projection optical system. A projection image of the phase shift transparent portion $b_1$ has an amplification distribution $Ab_1$ (FIG. 2D) on the wafer.

Figure 2E:
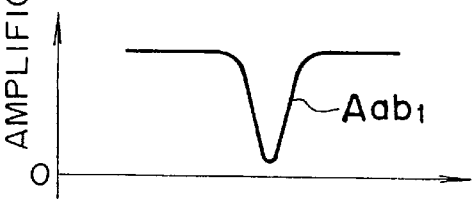
Figure 2F:
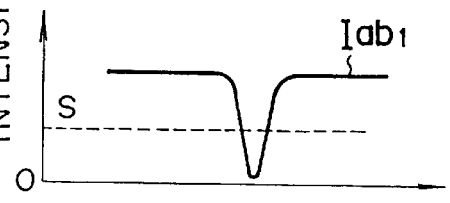

The amplification distribution of the actual image corresponds to the sum of these amplification distributions $Aa_1$ and $Ab_1$. FIG. 2E shows an amplification distribution $Aab_1$ obtained by synthesizing the amplification distributions $Aa_1$ and $Ab_1$. Since the intensity of each image beam is equivalent to the square of the absolute value of a corresponding one of the values of the amplification distribution $Aab_1$, an intensity distribution $Iab_1$ shown in FIG. 2F is obtained. In this case, a dark point is formed on the bright underlying portion, and hence a negative resist is required to form a hole pattern. Note that a broken line S in FIG. 2F indicates a threshold level of resist sensitivity. A portion to which is given an energy intensity lower than this threshold level is dissolved and removed upon development.

Figure 3A:
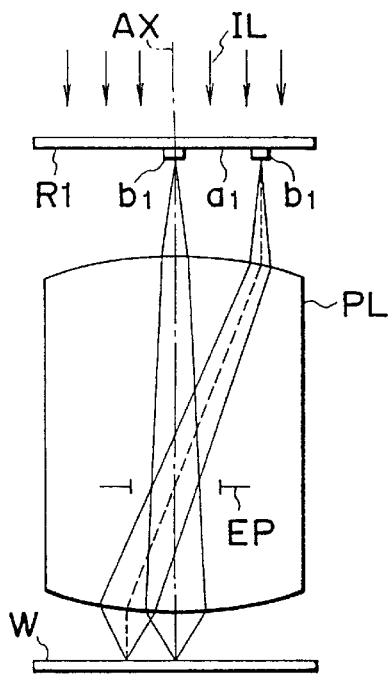
FIGS. 3A to 3E are views illustrating the phenomenon, described with reference to FIGS. 2A to 2F, on the basis of the concept of a re-diffraction optical system.
Figure 3B:
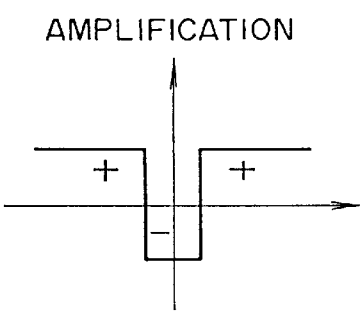
Figure 3C:
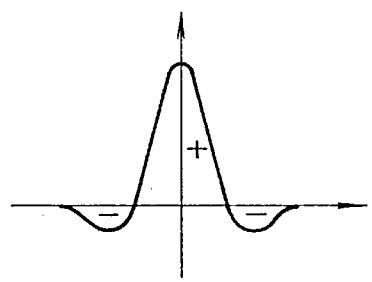
Figure 3D:
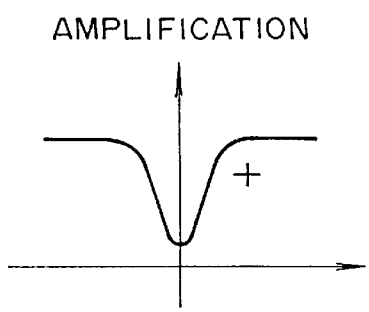
Figure 3E:
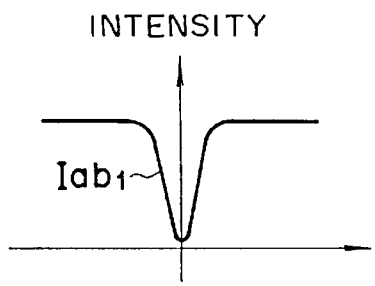

FIGS. 3A to 3E are views illustrating the above-described phenomenon on the basis of the concept of a re-diffraction optical system. Referring to FIG. 3A, assume that illumination light IL is vertically incident on the reticle R1. Light transmitted through the reticle R1 is focused on a wafer W by a telecentric projection optical system PL, thus forming a reticle pattern image on the wafer W. A Fourier transform corresponding plane (pupil plane) with respect to a reticle pattern is present in the projection optical system PL. FIG. 3B shows an amplification distribution obtained after the light is transmitted through the reticle pattern, i.e., a distribution obtained on the object plane side of the projection optical system PL. This distribution undergoes Fourier transform and becomes the amplification distribution shown in FIG. 3C on the pupil plane EP. Since the pupil plane EP is limited in size (radius), i.e., a numerical aperture NA, an amplification distribution at a position separated from an optical axis AX on the pupil plane EP by a distance corresponding to a value exceeding the numerical aperture NA is not transferred to the wafer W. That is, high-frequency components in a Fourier spectrum are cut by the projection optical system PL, and only low-frequency components are transferred to the wafer W (a position on the optical axis AX corresponds to zero frequency). For this reason, a projection image formed on the wafer W is slightly blurred with respect to the reticle pattern (phase shift transparent portion $b_1$). An amplification distribution obtained by performing Fourier transform of the amplification distribution (FIG. 3C) again corresponds to the amplification distribution of an image on the wafer surface (accurately, a best focal plane). FIG. 3D shows this amplification distribution. When the absolute values of the amplification distribution in FIG. 3D are squared, the intensity distribution (FIG. 3E) of the projection image on the best focal plane is obtained.

Note that the above description is made to explain the principle of the first embodiment of the present invention to be described below, and that the function described above is not that especially obtained by the present invention but is a general physical phenomenon.

Figure 1A:
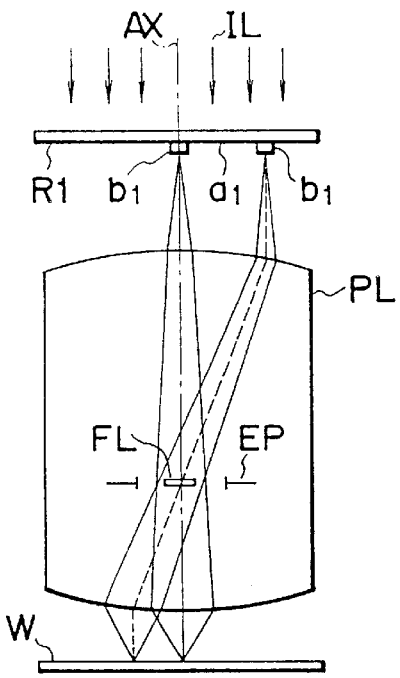
FIG. 1A is a view showing the arrangement of a projection exposure apparatus for embodying an exposure method according to the first embodiment of the present invention.
Figure 1B:
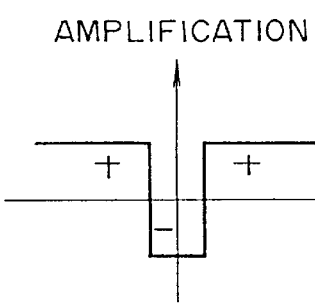
FIGS. 1B to 1E are charts, each showing a light amplification or intensity distribution on a predetermined surface in FIG. 1A.
Figure 1C:
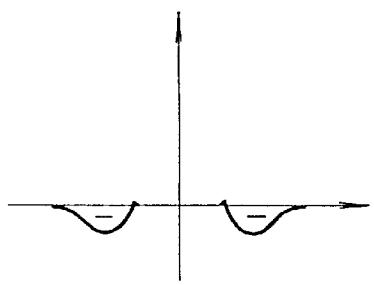

The first embodiment of the present invention will be described below with reference to FIGS. 1A to 1E. The arrangement shown in FIG. 1A is basically the same as that shown in FIG. 3A. In this embodiment, however, a light-shielding plate FL is arranged near a pupil plane EP in a projection optical system PL. The light-shielding plate FL serves to cut light components distributed near the optical axis. Assume that a reticle R1 is identical to the one shown in FIG. 3A. Therefore, light which is transmitted through a reticle pattern, i.e., light on the object plane side of the projection optical system PL, has an amplification distribution such as the one shown in FIG. 1B, which is identical to that shown in FIG. 3B. However, as shown in FIG. 1C, the amplification distribution on the pupil plane EP is greatly different from that shown in FIG. 3C, because of the light-shielding plate FL. That is, amplification components near an optical axis AX are completely removed (amplification=0).

Similar to the above description, in this embodiment, the amplification distribution of a projection image on the wafer W surface (accurately, the best focal plane) is the inverse Fourier transform of the amplification distribution (FIG. 1C) on the pupil plane EP. However, since low-frequency components, i.e., components near the optical axis, are removed from the amplification distribution on the pupil plane EP, a beam of light corresponding to a large-area bright portion (i.e., a portion corresponding to frequencies ranging from zero frequency to a low frequency) is not transmitted to the wafer W. For this reason, only the negative portions of the high-frequency components existing at a peripheral portion of the pupil plane EP are transmitted to the wafer W. As a result, an amplification distribution of small negative amplifications appears on the wafer W, as shown in FIG. 1D.

Figure 1D:
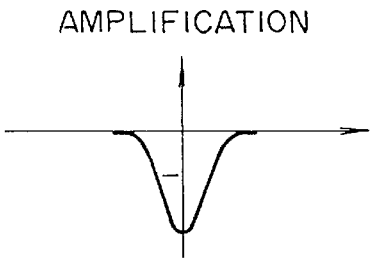
Figure 1E:
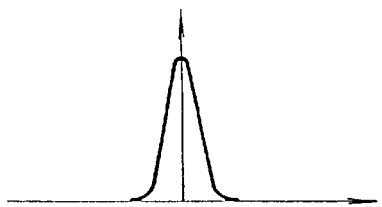

Since the intensity distribution of the projection image is obtained by squaring the absolute values of the amplification distribution shown in FIG. 1D, the intensity distribution corresponds to a small bright pattern such as the one shown in FIG. 1E. With this intensity distribution, a small region of a positive resist is sensitized and dissolved to form a hole pattern. In addition, since the high-frequency components, of the frequency components transmitted to the wafer W, are relatively emphasized, a finer pattern can be transferred. Furthermore, since low-frequency components are shielded, a beam of light from a large-area underlying transparent portion $a_1$ is cut by the light-shielding plate FL and does not reach the wafer W, so that the corresponding portion on the wafer W becomes a completely dark portion. Assume that the size of a phase shift transparent portion $b_1$ as an original image of a hole pattern is set such that one side or the diameter substantially corresponds to the resolution of the projection optical system PL.

As described above, in the embodiment, the combination of the all shifter reticle and the light-shielding plate FL in the projection optical system PL allows the formation of a fine hole pattern even by using a positive photoresist. In this case, the embodiment may employ the multiple imaging method, in which an object (wafer) to be exposed is sequentially exposed a plurality of times while the object is slightly shifted in the direction of the optical axis of the projection optical system, as described above. With this method, the effect of increasing the focal depth can be further enhanced.

Figure 6A:
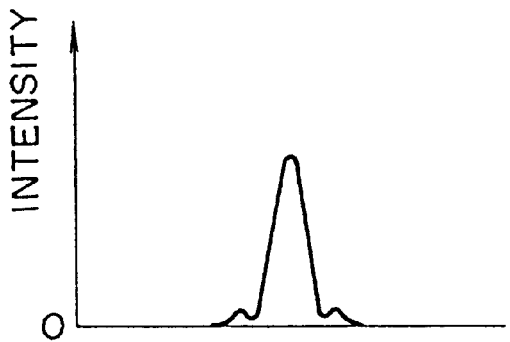
FIGS. 6A to 6D are charts, each showing the intensity distribution of a hole pattern in a case wherein a multiple imaging exposure method is used in the first embodiment.
Figure 6B:
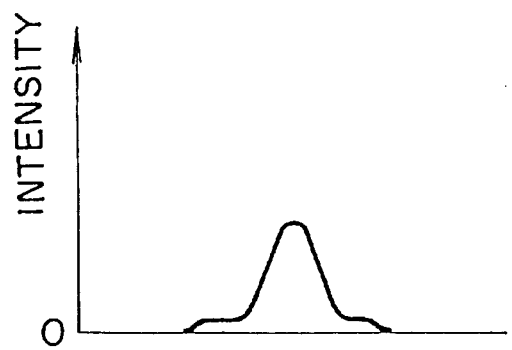
Figure 6C:
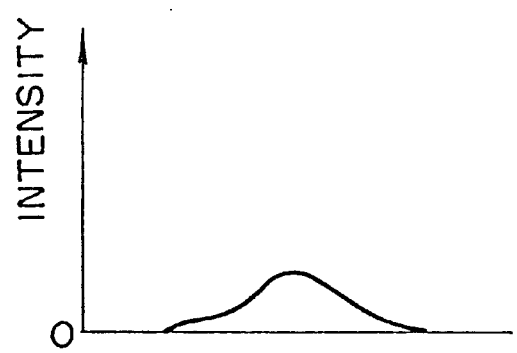
Figure 6D:
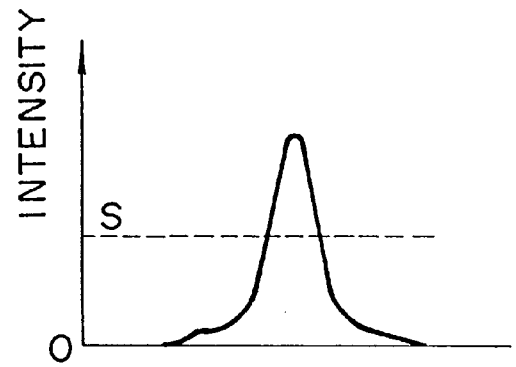

FIGS. 6A to 6D show such a state. FIGS. 6A to 6C show projection images of a hole pattern which are obtained in the embodiment. FIG. 6A shows the intensity distribution of a hole pattern image in a best focus state. FIGS. 6B and 6C respectively show intensity distributions in defocus states of predetermined defocus amounts. When multiple imaging (light amount synthesis) of the respective intensity distributions in FIGS. 6A to 6C is performed, the intensity distribution shown in FIG. 6D is obtained. It is apparent, therefore, that a hole pattern is formed on a positive resist, while almost no film reduction (sensitization) occurs at other portions.

In the case shown in FIGS. 6A to 6D, the focus position is discretely changed. However, the same effect of increasing the focal depth can be obtained even by continuously moving the wafer in the direction of the optical axis in the process of one exposure operation (giving a proper amount of exposure light to one region to be exposed), instead of exposing the wafer a plurality of times. This method is advantageous in terms of processing time (throughput). In the method, the reticle or the projection optical system may be moved during exposure instead of moving the wafer.

Figure 8A:
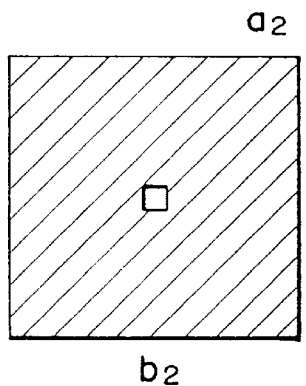
FIG. 8A is a plan view showing the structure of a reticle pattern used in the second embodiment.

The second embodiment of the present invention will be described below. FIG. 8A shows a pattern of a reticle R2 used in this embodiment. This reticle has the same arrangement as that of the halftone type phase shift reticle used for hole pattern formation based on the negative photoresist described above. That is, a transparent portion $b_2$ serving as a hole pattern is present in an underlying layer $a_2$ as a phase shift transparent portion having a transmittance of about 5% to 30%.

Figure 8B:
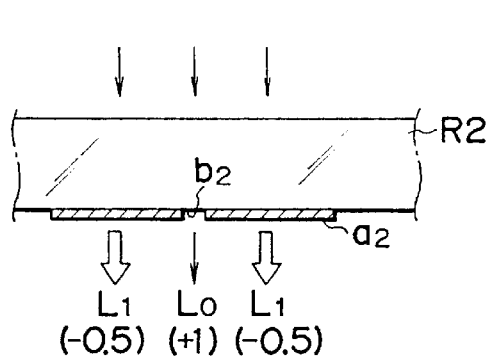
FIG. 8B is a sectional view of the reticle pattern in FIG. 8A.

FIG. 8B is a sectional view of the reticle pattern shown in FIG. 8A. If the amplification of light $L_0$ transmitted through the transparent portion $b_2$ is +1, the sign of the amplification of light $L_1$ transmitted through the phase shift transparent portion $a_2$ is negative. The magnitude of the light $L_1$ corresponds to the square root of the energy transmittance of the phase shift transparent portion $a_2$. Note that the energy transmittance of the underlying layer $a_2$ is set to be 25% in the arrangement shown in FIG. 8A.

Figure 8C:
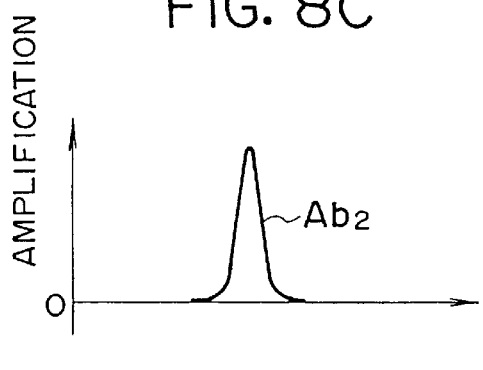
FIGS. 8C to 8F are charts, each showing the amplification or intensity characteristics of a projection image in a case wherein the reticle pattern in FIG. 8A is mounted on a conventional projection exposure apparatus.
Figure 8D:
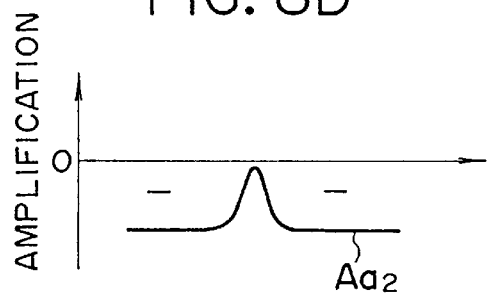

If the projection optical system has a general arrangement (including no light-shielding member and the like used in the present invention), a projection image of the transparent portion $b_2$ has an amplification distribution $Ab_2$ (FIG. 8C) on a wafer. Note that the curve of the amplification distribution $Ab_1$ is slightly moderated depending on the type of a projection optical system. A projection image of the phase shift transparent portion $a_2$ has an amplification distribution $Aa_2$ (FIG. 8D) on the wafer.

Figure 8E:
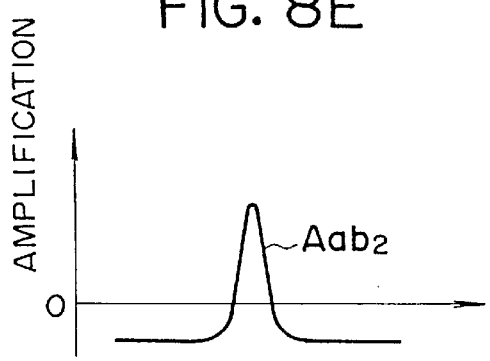
Figure 8F:
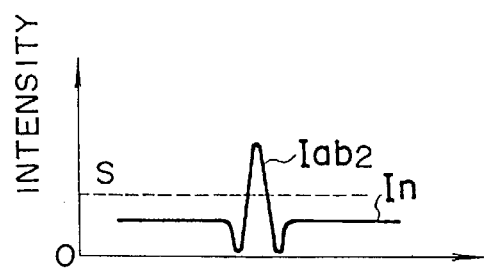

The amplification distribution of the actual image corresponds to the sum of these amplification distributions $Aa_2$ and $Ab_2$. FIG. 8E shows an amplification distribution $Aab_2$ obtained by synthesizing the amplification distributions $Aa_2$ and $Ab_2$. Since the intensity of each image beam is equivalent to the square of the absolute value of a corresponding one of the values of the amplification distribution $Aab_2$, an intensity distribution $Iab_2$ shown in FIG. 8F is obtained. In this case, a bright point is formed on the dark underlying portion, and hence a positive resist is required to form a hole pattern. Note that a broken line S in FIG. 8F indicates a threshold level of resist sensitivity. A portion to which is given an energy intensity higher than this threshold level is dissolved and removed upon development.

The intensity distribution $Iab_2$, however, includes an intensity distribution In as a noise component as well as the required intensity distribution as the transparent portion $b_2$ for a hole pattern. For this reason, if the light amount of the intensity distribution In is large, the positive resist is subjected to film reduction (sensitization). Note that the width of a bright portion (hole pattern) is further reduced due to the cancellation (interference effect) between the light $L_0$ and the light $L_1$ respectively transmitted through the transparent portion $b_2$ and the phase shift transparent portion $a_2$. For this reason, in order to obtain a bright portion having a smaller width, the transmittance of the phase shift transparent portion $a_2$ must be set to be relatively high (e.g., 5% or more).

Figure 9A:
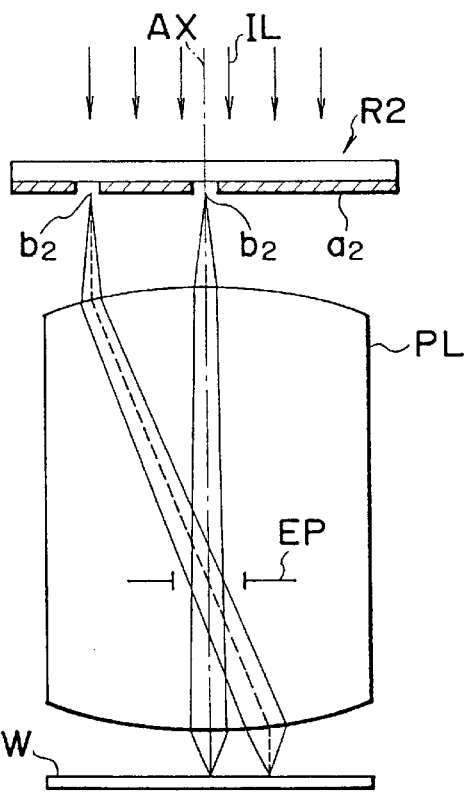
FIGS. 9A to 9E are views illustrating the phenomenon, described with reference to FIGS. 8A to 8F, on the basis of the concept of a re-diffraction optical system.
Figure 9B:
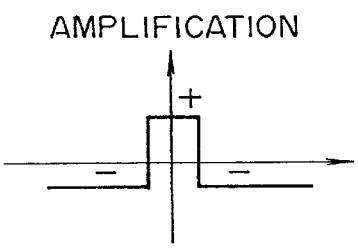
Figure 9C:
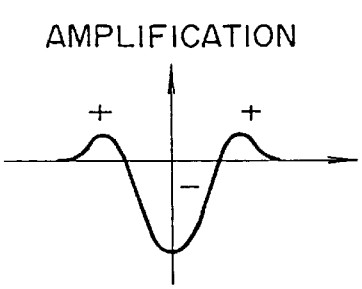

FIGS. 9A to 9E are views illustrating the above-described phenomenon on the basis of the concept of the re-diffraction optical system. Referring to FIG. 9A, assume that illumination light IL is vertically incident on the reticle R2. Light transmitted through the reticle R2 is focused on a wafer W by the projection optical system PL, thus forming a reticle pattern image on the wafer W. Light which is transmitted through a reticle pattern, i.e., light on the object plane side of the projection optical system PL, has an amplification distribution such as the one shown in FIG. 9B, which distribution undergoes Fourier transform to become an amplification distribution such as the one shown in FIG. 9C on a pupil plane EP. Since the pupil plane EP is limited in size (radius), i.e., a numerical aperture NA, an amplification distribution at a position separated from an optical axis AX on the pupil plane EP by a distance corresponding to a value exceeding the numerical aperture NA is not transferred to the wafer W. That is, high-frequency components in a Fourier spectrum are cut by the projection optical system PL, and only low-frequency components are transferred to the wafer W. For this reason, a projection image formed on the wafer W is slightly blurred with respect to the reticle pattern (phase shift transparent portion $b_2$).

Figure 9D:
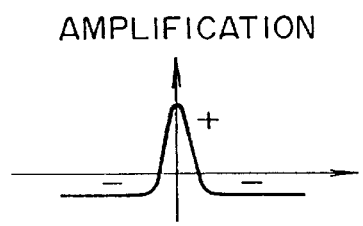
Figure 9E:
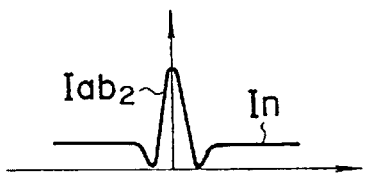

An amplification distribution obtained by performing Fourier transform of the amplification distribution (FIG. 9C) again corresponds to the amplification distribution of an image on the wafer surface (accurately, a best focal plane). FIG. 9D shows this amplification distribution. When the absolute values of the amplification distribution in FIG. 9D are squared, the intensity distribution (shown in FIG. 9E) of the projection image on the best focal plane is obtained.

Note that the above description is made to explain the principle of the second embodiment of the present invention to be described below, and that the function described above is not that especially obtained by the present invention but is a general physical phenomenon.

Figure 7A:
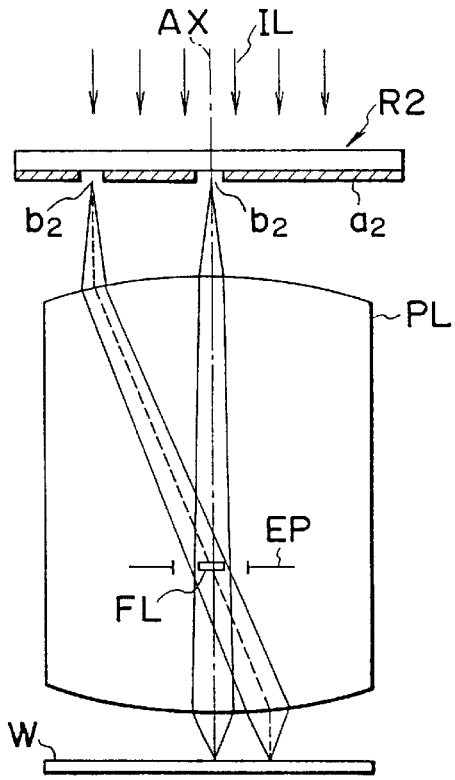
FIG. 7A is a view showing the arrangement of a projection exposure apparatus for embodying an exposure method according to the second embodiment of the present invention.
Figure 7B:
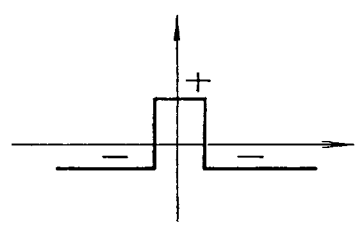
FIGS. 7B to 7E are charts, each showing a light amplification or intensity distribution on a predetermined surface in FIG. 7A.
Figure 7C:
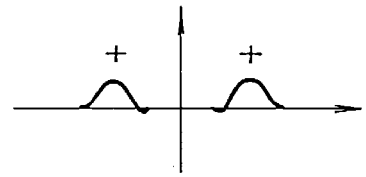

The second embodiment of the present invention will be described below with reference to FIGS. 7A to 7E. The arrangement shown in FIG. 7A is basically the same as that shown in FIG. 9A. Similar to the first embodiment, in the second embodiment, a light-shielding plate FL is arranged near a pupil plane EP in a projection optical system PL. This light-shielding plate FL serves to cut light components distributed near the optical axis, and has the same arrangement as that in the first embodiment (FIG. 1A). Assume that a reticle R2 is identical to the one shown in FIG. 9A. Light which is transmitted through a reticle pattern, i.e., light on the object plane side of the projection optical system PL, has an amplification distribution such as the one shown in FIG. 7B. However, as shown in FIG. 7C, the amplification distribution on the pupil plane EP is greatly different from that shown in FIG. 9C because of the light-shielding plate FL. That is, amplification components near an optical axis AX are completely removed (amplification=0).

Similar to the above description, in this embodiment, the amplification distribution of a projection image on the wafer W surface (accurately, the best focal plane) is the inverse Fourier transform of the amplification distribution (FIG. 7C) on the pupil plane EP. However, since low-frequency components, i.e., components near the optical axis, are removed from the amplification distribution on the pupil plane EP, a beam of light corresponding to a large-area bright portion (i.e., a portion corresponding to frequencies ranging from zero frequency to a low frequency) is not transmitted to the wafer W. For this reason, only the positive portions of the high-frequency components existing at a peripheral portion of the pupil plane EP are transmitted to the wafer W. As a result, an amplification distribution of small amplifications appears on the wafer W, as shown in FIG. 7D.

Figure 7D:
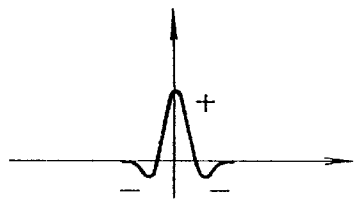
Figure 7E:
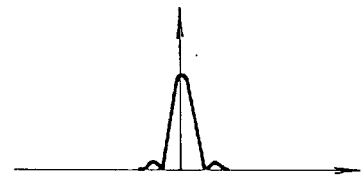

Since the intensity distribution of the projection image is obtained by squaring the absolute values of the amplification distribution shown in FIG. 7D, the intensity distribution corresponds to a small bright pattern such as the one shown in FIG. 7E from which the intensity distribution In as noise is cut. With this intensity distribution, a small region of a positive resist is sensitized and dissolved to form a hole pattern. In addition, since the high-frequency components, of the frequency components transmitted to the wafer W, are relatively emphasized, a finer pattern can be transferred. Furthermore, since low-frequency components are shielded, a beam of light from a large-area phase shift transparent portion $a_2$ is cut by the light-shielding plate FL and does not reach the wafer W, so that the corresponding portion on the wafer W becomes a completely dark portion. For this reason, there is no possibility of film reduction (sensitization) of the positive resist. Assume that the size of a transparent portion $b_2$ as an original image of a hole pattern is set such that one side or the diameter substantially corresponds to the resolution of the projection optical system PL.

As described above, in the embodiment, the combination of the all shifter reticle and the light-shielding plate FL in the projection optical system PL allows the formation of a fine hole pattern even by using a positive photoresist. In this case, the embodiment may employ the multiple imaging method, in which an object (wafer) to be exposed is sequentially exposed a plurality of times while the object is slightly shifted in the direction of the optical axis of the projection optical system, as described above. With this method, the effect of increasing the focal depth can be further enhanced.

Figure 10A:
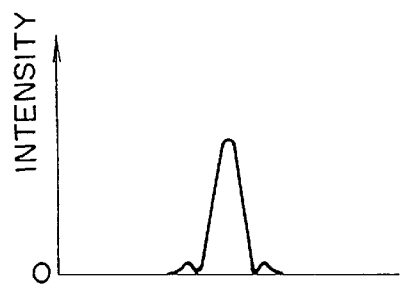
FIGS. 10A to 10H are charts, each showing the intensity distribution of a hole pattern image in a case wherein the multiple imaging exposure method is used in the second embodiment.
Figure 10E:
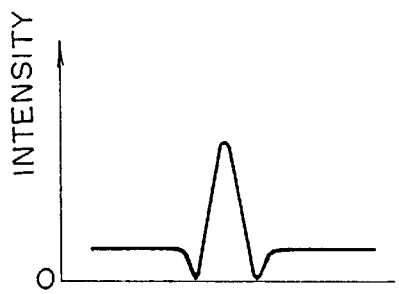
Figure 10B:
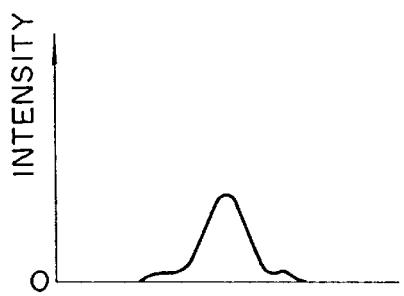
Figure 10F:
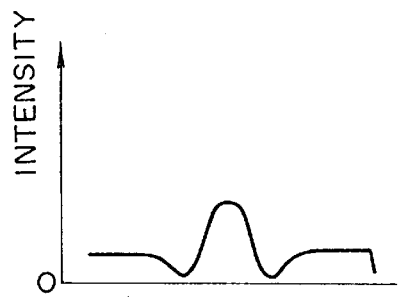
Figure 10C:
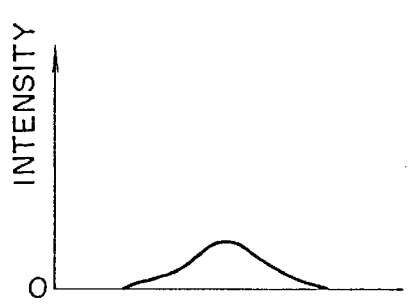
Figure 10G:
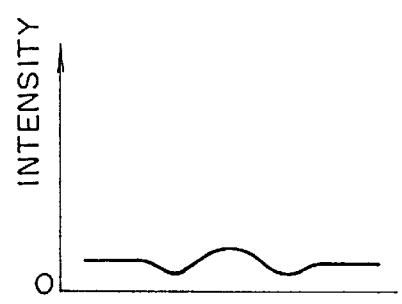
Figure 10D:
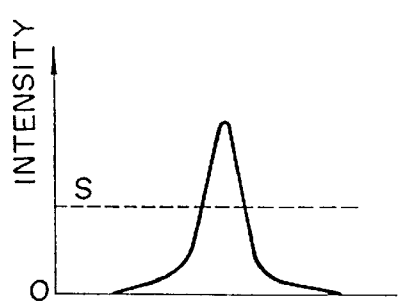

FIGS. 10A to 10H show such a state. FIGS. 10A to 10C show projection images of a hole pattern which are obtained in the second embodiment. FIG. 10A shows the intensity distribution of a hole pattern image in a best focus state. FIGS. 10B and 10C respectively show intensity distributions in defocus states of predetermined defocus amounts. When multiple imaging (light amount synthesis) of the respective intensity distributions in FIGS. 10A to 10C is performed, the intensity distribution shown in FIG. 10D is obtained. It is apparent, therefore, that a hole pattern is formed on a positive resist, while almost no film reduction (sensitization) occurs at other portions.

FIGS. 10E to 10G show a case wherein a halftone type phase shift reticle and a projection optical system without the light-shielding plate FL are used.

Figure 10H:
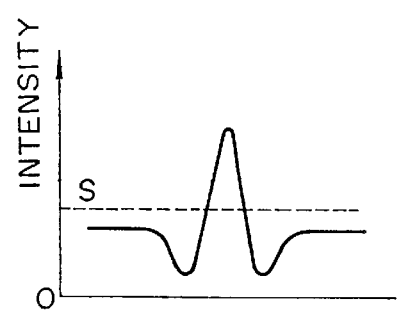

FIG. 10E shows the intensity distribution of a hole pattern image in a base focus state. FIGS. 10F and 10G respectively show intensity distributions in defocus states. When multiple imaging (light amount synthesis) of the respective intensity distributions in FIGS. 10E to 10G is performed, the light amount (noise component In) of other portions with respect to the hole pattern is not a negligible value, as shown in FIG. 10H. As a result, the positive resist may undergo film reduction. Therefore, if only a halftone type phase shift reticle is used, a further increase in focal depth cannot be achieved even by using the multiple imaging method.

In the case shown in FIGS. 10A to 10D, the focus position is discretely changed. However, the same effect of increasing the focal depth can be obtained even by continuously moving the wafer in the direction of the optical axis in the process of one exposure operation (giving a proper amount of exposure light to one region to be exposed), instead of exposing the wafer a plurality of times. This method is advantageous in terms of processing time (throughput). In the method, the reticle or the projection optical system may be moved during exposure instead of moving the wafer.

In the first and second embodiments described above, the actual incident angle of the beam IL illuminating the reticles R1 and R2 includes not only 90° but also other values within a certain range (numerical aperture). It is preferable that these values fall within the range of 0.1 times to 0.3 times the reticle-side numerical aperture of the projection optical system PL ($0.1 \leq \sigma \leq 0.3$). Generally, a ratio of a numerical aperture of an illumination optical system (a sine of an incident angle range of beams for illuminating the reticle) and a reticle side numerical aperture of a projection optical system is called a σ value, which is a coherence factor in the illumination optical system. Accordingly, if the σ value is greater than 0.3, the effect of interference between light components respectively transmitted through the phase shift transparent portion $b_1$ and the underlying transparent portion $a_1$ in the first embodiment (the transparent portion $b_2$ and the phase shift transparent portion $a_2$ in the second embodiment) is reduced, resulting in a reduction in the effect of the present invention.

The radius of the light-shielding plate FL at the pupil plane EP of the projection optical system PL is preferably set to be about 0.4 times that of the pupil plane EP of the projection optical system PL in order to shield all the direct light components (0-th-order light components) from the illumination optical system described above. If, however, the a value determined by the size of a light source image of an illumination optical system is relatively small, e.g., 0.1, the radius of the light-shielding portion of the light-shielding plate FL may be set to be about 0.2 times that of the pupil plane EP. Although the focal depth of a pattern image is increased with an increase in the radius of the light-shielding portion of the light-shielding plate FL, the light amount (illuminance on the wafer) is decreased. In consideration of the balance between the light amount and the focal depth, the maximum effect can be obtained by light-shielding light in an amount corresponding to 60 to 70% of the pupil radius.

As shown in FIGS. 1E and 7E, the intensity distributions with respect to the hole pattern images, which are obtained in the first and second embodiments, are almost equal in fineness to those obtained by the conventional multiple imaging amplification synthesizing method. However, the light-absorbing filter in the projection optical system used in the multiple imaging amplification synthesizing method is required to continuously change its transmittance in accordance with the distance from the optical axis, and must have a phase inversion property. Such a filter is difficult to manufacture. In contrast to this, the light-shielding plate FL in the present invention may be constituted by a complete light-shielding member and hence can be very easily manufactured by using a thin metal plate or the like.

As a countermeasure against heat generation or heat accumulation by light absorption, a cooling member or a temperature adjusting member may be arranged on the light-shielding plate FL. For example, a thin pipe through which a coolant flows may be mounted along the light-shielding portion of the light-shielding plate FL to cool the plate. Since this pipe is covered with the light-shielding portion of the light-shielding plate FL, it has no influence on the imaging characteristics. A light-absorbing filter used in the conventional multiple imaging amplification synthesizing method needs to transmit a beam of light. Therefore such a cooling mechanism cannot be used in the conventional method.

Figure 4:
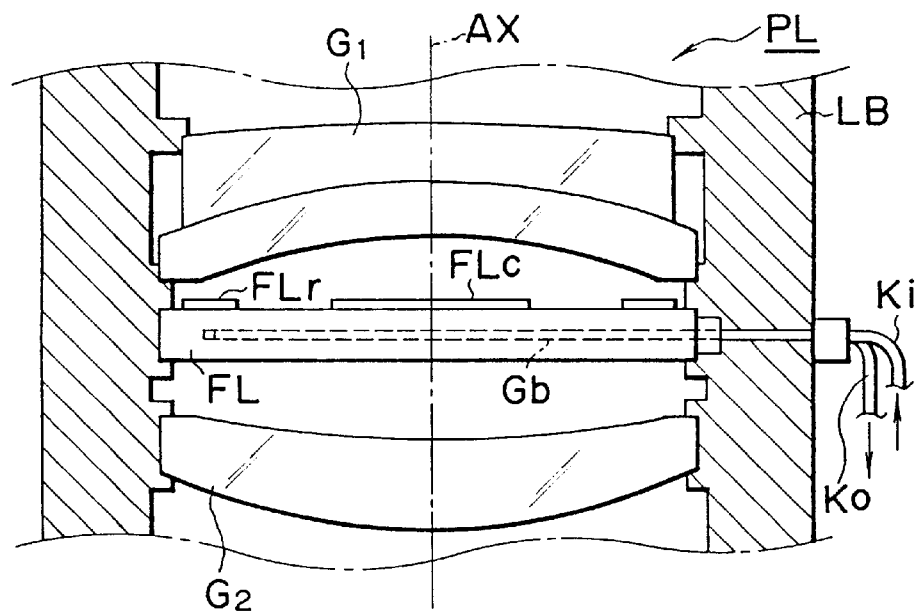
FIG. 4 is a sectional view of a portion of a projection optical system
Figure 5:
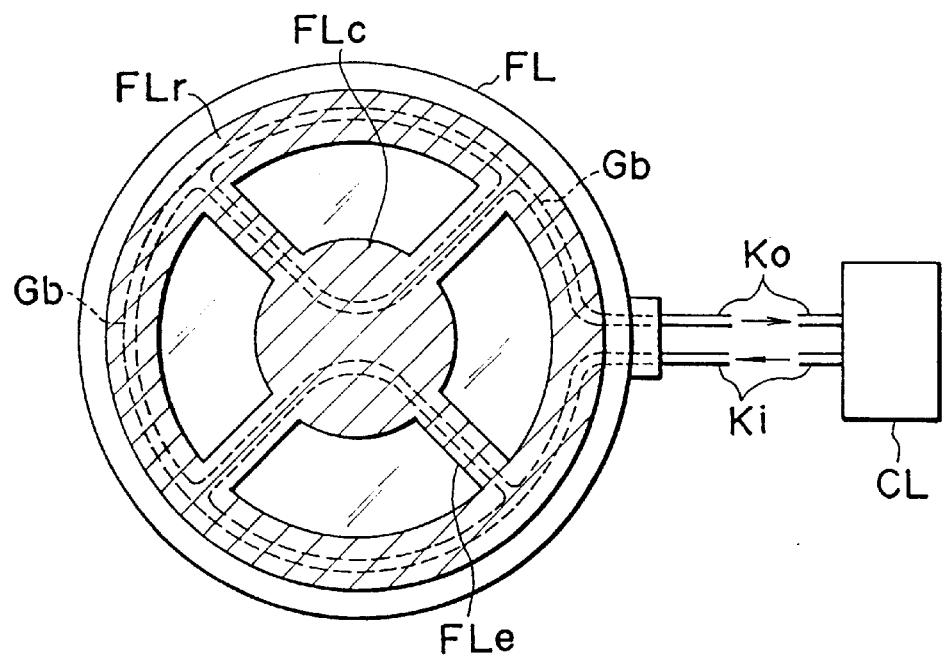
FIG. 5 is a view showing the detailed structure of a light-shielding plate.

FIGS. 4 and 5 show a cooling mechanism suitable for the light-shielding plate FL used in the first and second embodiments.

FIG. 4 is a partial sectional view of the interior of the projection optical system PL having the light-shielding plate FL arranged therein. The light-shielding plate FL is mounted near the pupil plane EP in a lens barrel LB. Assume that the pupil plane EP is located in a space (air gap) between lens elements $G_1$ and $G_2$ in the projection optical system PL in FIG. 4. The light-shielding plate FL has a central light-shielding portion FLc consisting of a metal material and formed on the upper surface (reticle side) of a transparent nitride material such as quartz, and an annular light-shielding portion FLr formed around the pupil plane EP. As shown in FIG. 5, the central light-shielding portion FLc has a circular shape, and the annular light-shielding portion FLr is larger than the effective pupil radius so as not to eclipse a beam of high-frequency light components. In addition, the light-shielding plate FL has a two-layer structure, i.e., upper and lower quartz plates constituting a light-shielding portion. A narrow groove (whose depth and width are both about 2 mm) Gb is formed in the interface between the two plates to allow a cooling fluid (gas or liquid) to flow. The groove Gb is formed such that a fluid from a fluid supply hole Ki circulates along the annular light-shielding portion FLr and is exhausted from an exhaust hole Ko, as shown in FIG. 5. In addition, the groove Gb is formed to allow the fluid to flow under four connecting light-shielding portions FLe connecting the central light-shielding portion FLc to the annular light-shielding portion FLr, thereby cooling a portion immediately under the central light-shielding portion FLc. The fluid supply hole Ki and the exhaust hole Ko are connected to a cooler (temperature controller) CL. The cooler CL supplies a cooling fluid, whose temperature is controlled, to the groove Gb through the fluid supply hole Ki.

In this case, the light-shielding portions FLc, FLr, and FLe are formed on the quartz plate. However, a thin metal plate may be cut into the shape of the light-shielding portion shown in FIG. 5, and this cut portion may be detachably mounted at the pupil plane EP. In such a case, even if the light-shielding plate formed from the thin metal plate is inserted/removed in/from the projection optical system PL, since the transparent portion includes no transparent quartz portion such as the one shown in FIG. 4, the influence on the optical characteristics is small.

Each of the phase shift reticles in the first and second embodiments can increase the amount of diffracted light from a pattern as compared with the conventional reticles, and hence can increase the amount of light reaching the wafer W as compared with the multiple imaging amplification synthesizing method. In addition, the phase shift reticle used in the first embodiment can be obtained by only forming the small phase shift transparent portion $b_1$ in the underlying transparent portion $a_1$ constituted by a quartz plate, and requires no complete light-shielding portion (chromium layer or the like). Therefore, patterning of the reticle needs to be performed only once, and no stacking of layers is required, thus greatly facilitating the manufacturing process. Another advantage is that the same amount of pattern data that required for a conventional complete transparent/complete light-shielding reticle is enough for the manufacture of this reticle. This equally applies to the phase shift reticle used in the second embodiment, and substantially the same effects as those obtained in the first embodiment can be obtained.

Another phase shift reticle which can be applied to the first embodiment may be obtained by forming the underlying transparent portion $a_1$ and the phase shift transparent portion $b_1$ in a reverse manner. Another phase shift reticle which can be applied to the second embodiment may be formed by using a bare glass surface as the transparent portion $b_2$ and a two-layer structure constituted by a thin metal film (light-attenuating member) and a thin dielectric film (phase shift member), or the like, as the phase shift transparent portion $a_2$.

Furthermore, as a projection optical system used in each embodiment described above, in addition to a refraction system, a reflection system or a combination of refraction and reflection systems may be used. As a light source, a bright line lamp such as a mercury lamp or a laser may be used. If the use of broad-band exposure lamp is allowed because, for example, the projection optical system is a reflection system, broad-band exposure light may be used. In this case, phase differences given to wavelength components other than a specific wavelength component by the phase shift transparent portions $b_1$ and $a_2$ deviate from $\pi$ [rad]. The present invention, however, can still provide better effects than the conventional methods.

What is claimed is:

1. A projection exposure apparatus comprising:
    a projection optical system for projecting a pattern formed on a mask onto an object, the pattern having a transparent portion which is substantially transparent to exposure light, and a phase shift portion for producing light whose phase is shifted from that of light transmitted through the transparent portion by substantially an odd number multiple of π;

a limiting member, located substantially at a Fourier transform plane having an optical Fourier transform relationship with a pattern surface of said mask in said projection optical system, for limiting a beam of light passing through the Fourier transform plane, which propagates near an optical axis of said projection optical system;

a temperature control device for controlling a temperature of said limiting member; and a varying member for varying a distance between said object and an image plane of said projection optical system relating to the pattern of said mask, in a direction of the optical axis during an exposure operation with respect to one region on said object.

2. A projection exposure apparatus according to claim 1, wherein said limiting member comprises a circular light-shielding or light-absorbing portion for limiting the beam.

3. A projection exposure apparatus according to claim 2, wherein said temperature control device supplies a temperature-controlled fluid to said limiting member to cool said light-shielding or light-absorbing portion.

4. A projection exposure apparatus according to claim 1, wherein a positive type photoresist is coated on a surface of said object.

5. An exposure method of projecting, through a projection optical system, a pattern formed on a mask onto an object, comprising:

placing a mask on an object plane side of said projection optical system, the pattern having a transparent portion which is substantially transparent to exposure light, and a second transparent portion for producing light whose phase is shifted from that of light transmitted through the transparent portion by substantially an odd number multiple of π and having a predetermined transmittance of the light passing therethrough;

arranging a limiting member for limiting a light beam passing through a Fourier transform plane, which propagates near an optical axis of said projection optical system, substantially on the Fourier transform plane, said Fourier transform plane having an optical Fourier transform relationship with a pattern surface of said mask in said projection optical system; and controlling a temperature of said limiting member.

6. A method according to claim 5, wherein said second transparent portion has a transmittance of about 5 to 30%.

7. A method according to claim 5, wherein a coherence factor σ of an illumination optical system for radiating an exposure light on said mask is set to be about 0.1 to 0.3.

8. A method according to claim 5, wherein a radius of a circular light-shielding portion of said limiting member for limiting the beam is set to be not less than about 0.2–0.4 times a radius of a pupil of said projection optical system.

9. A method according to claim 8, wherein a radius of the light-shielding portion is set to be about 0.6 to 0.7 times a radius of a pupil of said projection optical system.

10. A projection exposure apparatus comprising:

a projection optical system for projecting a pattern formed on a mask onto an object, the pattern having a transparent portion which is substantially transparent to exposure light, and an attenuating portion having a predetermined transmittance of about 5 to 30%, and producing attenuated light whose phase is shifted from that of light transmitted through the transparent portion by substantially an odd number multiple of π;

a light-shielding member, located substantially at a Fourier transform plane having an optical Fourier transform relationship with a pattern surface of said mask in said projection optical system, for limiting a beam of light passing through the Fourier transform plane, which propagates near an optical axis of said projection optical system; and a system which continuously varies a distance between said object and an image plane of said projection optical system relating to the pattern of said mask, in a direction of the optical axis during an exposure operation with respect to one region on said object.

11. A projection exposure apparatus according to claim 10, further comprising a temperature control system for supplying a temperature-controlled fluid to said light-shielding member to cool said light-shielding member.

12. A projection exposure apparatus according to claim 10, wherein a positive type photoresist is coated on a surface of said object.

13. A projection exposure apparatus according to claim 10, wherein a radius of said light-shielding member is not less than an order of 0.2–0.4 times a radius of a pupil of said projection optical system.

14. A projection exposure apparatus according to claim 10, wherein a radius of said light-shielding member is an order of 0.6 to 0.7 times a radius of a pupil of said projection optical system.

15. An exposure method of projecting, through a projection optical system, a pattern formed on a mask onto an object, comprising:

placing a mask on an object plane side of said projection optical system, the pattern having a transparent portion which is substantially transparent to exposure light, and a phase shift portion for producing light whose phase is shifted from that of light transmitted through the transparent portion by substantially an odd number multiple of π and having a transmittance of about 5 to 30%;

shielding a light beam passing through a Fourier transform plane, which propagates near an optical axis of said projection optical system, with a light-shielding member which is located substantially at the Fourier transform plane, said Fourier transform plane having an optical Fourier transform relationship with a pattern surface of said mask in said projection optical system; and continuously varying a distance between said object and an image plane of said projection optical system relating to the pattern of said mask, in a direction of the optical axis during an exposure operation with respect to one region on said object.

16. An exposure method according to claim 15, wherein said pattern on said mask is formed by one patterning operation.

17. A projection exposure apparatus which exposes a pattern of a mask onto an object, comprising:

a projection optical system, located between said mask and said object, to project an image of the pattern formed on said mask onto said object, the pattern having a transparent portion which is substantially transparent to exposure light, and a phase shift portion to produce light whose phase is shifted from that of light transmitted through the transparent portion by substantially an odd number multiple of π and having a lower transmittance than that of said transparent portion; and a light-shielding member, located substantially at a Fourier transform plane having an optical Fourier transform relationship with a pattern surface of said mask in said projection optical system, to shield light which leaks out of said phase shift portion so as not to reach said object, wherein said shielding does not invert the phase of a beam of light that passes through said Fourier transform plane, a radius of said light-shielding member being about 0.2–0.4 times as large as the radius of a pupil of said projection optical system.

18. A projection exposure apparatus according to claim 17, wherein said light-shielding member is made of metal, and the shielding of light is carried out by shielding a portion of a beam of light substantially incident on the Fourier transform plane, which propagates near an optical axis of said projection optical system.

19. A projection exposure apparatus according to claim 17, wherein the radius of said light-shielding member is about 0.2–0.4 times as large as the radius of the pupil of said projection optical system.

20. A projection exposure apparatus according to claim 17, wherein the size of said light-shielding member is about 0.6–0.7 times as large as the size of the pupil of said projection optical system.

21. A projection exposure apparatus according to claim 17, wherein said phase shift portion has a transmittance of about 5 to 30%.

22. A projection exposure apparatus according to claim 17, wherein said mask is a halftone type mask.

23. A projection exposure apparatus which exposes a pattern of a mask onto an object, comprising:

a projection optical system, located between said mask and said object, to project an image of the pattern formed on said mask onto said object, the mask being provided with a transparent portion which is substantially transparent to exposure light, and a phase shift portion to produce light whose phase is shifted from that of light transmitted through the transparent portion by substantially an odd number multiple of $\pi$ and having a lower transmittance than that of said transparent portion; and a light-shielding member, located substantially at a Fourier transform plane having an optical Fourier transform relationship with a pattern surface of said mask in said projection optical system, to shield a portion of a beam of light substantially incident on the Fourier transform plane, which propagates near an optical axis of said projection optical system, without inverting the phase of another portion of said beam of light, which passes through said Fourier transform plane, a radius of said light-shielding member being about 0.2–0.4 times as large as the radius of a pupil of said projection optical system.

24. A projection exposure apparatus according to claim 23, wherein said light-shielding member is made of metal.

25. A projection exposure apparatus according to claim 23, wherein said projection optical system is a telecentric system.

26. A projection exposure apparatus according to claim 23, wherein said mask is formed by one patterning operation.

27. A projection exposure apparatus according to claim 23, wherein said phase shift portion has a transmittance of about 5 to 30%.

28. A projection exposure apparatus according to claim 23, wherein said mask is a halftone type mask.

29. An exposure method of projecting, through a projection optical system, an image of a pattern formed on a mask onto an object, comprising:

placing the mask on an object plane side of said projection optical system, the mask being provided with a transparent portion which is substantially transparent to exposure light, and a phase shift portion to produce light whose phase is shifted from that of light transmitted through the transparent portion by substantially an odd number multiple of $\pi$, the phase shift portion having a transmittance of about 5 to 30% to said exposure light; and shielding a portion of a beam of light substantially incident on a Fourier transform plane, which propagates near an optical axis of said projection optical system, without inverting the phase of another portion of said beam of light, which passes through said Fourier transform plane, the Fourier transform plane having an optical Fourier transform relationship with a pattern surface of said mask in said projection optical system.

30. An exposure method according to claim 29, wherein the size of said transparent portion is determined in accordance with resolution of said projection optical system.

31. An exposure method according to claim 29, wherein said shielding step is performed in such a manner that the portion of said beam of light which propagates near said optical axis does not reach said object.

32. An exposure method according to claim 29, wherein said mask is formed by one patterning operation.

33. A substrate on which said pattern has been transferred by the method according to claim 29.

34. An exposure apparatus which exposes a pattern which shifts a phase, comprising:

a projection optical system to project an image of said pattern onto an object, said pattern being a halftone pattern; and a limiting member, located substantially at a Fourier transform plane in said projection optical system, to limit a portion of a beam of light substantially incident on said Fourier transform plane, which propagates near an optical axis of said projection optical system, without inverting the phase of another portion of said beam of light, which passes through said Fourier transform plane, a radius of said limiting member being about 0.2–0.4 times as large as the radius of a pupil of said projection optical system.

35. A projection exposure apparatus which exposes a pattern of a mask onto a substrate, comprising:

a projection optical system, located between said mask and said substrate, to project an image of the pattern formed on said mask onto said substrate;

a light-shielding member, located substantially at a Fourier transform plane having an optical Fourier transform relationship with a pattern surface of said mask in said projection optical system, to shield a beam of light passing through the Fourier transform plane, which propagates near an optical axis of said projection optical system, an area to be shielded by said light-shielding member being set based on at least one of an amount of exposure light to said substrate and a focal depth of said projection optical system; and a distance varying unit to vary a distance between said substrate and an image plane of said projection optical system relating to the pattern of said mask, in a direction of the optical axis during an exposure operation with respect to one region on said substrate.

36. A projection exposure apparatus according to claim 35, wherein said light-shielding member shields a portion of the beam of light without inverting the phase of another portion of said beam of light, which passes through said Fourier transform plane.

37. A projection exposure apparatus according to claim 35, wherein said light-shielding member entirely shields a portion of said beam of light that propagates near said optical axis.

38. A projection exposure apparatus according to claim 35, wherein said light-shielding member shields light in an amount corresponding to 60 to 70% of a pupil radius of said projection optical system.

39. An exposure method of exposing, through a projection optical system, a pattern formed on a mask onto a substrate, comprising:

shielding a beam of light passing through a Fourier transform plane, which propagates near an optical axis of said projection optical system, the Fourier transform plane having an optical Fourier transform relationship with a pattern surface of said mask in said projection optical system, an area to be shielded by said shielding being set based on at least one of an amount of exposure light to said substrate and a focal depth of said projection optical system; and continuously varying a distance between said substrate and an image plane of said projection optical system relating to the pattern of said mask, in a direction of the optical axis during an exposure operation with respect to one region on said substrate.

40. An exposure method according to claim 39, wherein said shielding is carried out without inverting the phase of a portion of said beam of light that passes through said Fourier transform plane.

41. An exposure method according to claim 39, wherein said shielding entirely shields a portion of said beam of light which propagates near said optical axis.

42. An exposure method according to claim 39, wherein said shielding shields light in an amount corresponding to 60 to 70% of a pupil radius of said projection optical system.

43. A method for making an exposure apparatus which exposes a pattern of a mask onto an object, comprising:

providing a projection optical system between said mask and said object to project said pattern onto said object, the pattern having a transparent portion which is substantially transparent to exposure light, and a phase shift portion which produces light whose phase is shifted from that of light transmitted through the transparent portion by substantially an odd number multiple of $\pi$ and has a lower transmittance than said transparent portion; and providing a light-shielding member, located substantially at a Fourier transform plane having an optical Fourier transform relationship with a pattern surface of said mask in said projection optical system, to shield a portion of a beam of light substantially incident on the Fourier transform plane, which propagates near an optical axis of projection optical system, without inverting the phase of another portion of said beam of light, which passes through said Fourier transform plane, a radius of said light-shielding member being about 0.2–0.4 times as large as the radius of a pupil of said projection optical system.

44. A method according to claim 43, further comprising: providing a distance varying unit which varies a distance between said object and an image plane of said projection optical system relating to the pattern of said mask, in a direction of the optical axis during an exposure operation with respect to one region on said object.

45. A method according to claim 43, wherein said phase shift portion has a transmittance of about 5 to 30%.

46. A method according to claim 43, wherein said mask is a halftone type mask.

47. An object on which a pattern has been transferred by an exposure apparatus manufactured by the method according to claim 43.

48. A projection exposure apparatus which exposes a pattern of a mask onto an object comprising:

a projection optical system, located between said mask and said object, to project said pattern onto said object, the pattern having a transparent portion which is substantially transparent to exposure light, and a phase shift portion which produces light whose phase is shifted from that of light transmitted through the transparent portion by substantially an odd number multiple of $\pi$;

a light-shielding member, located substantially at a Fourier transform plane having an optical Fourier transform relationship with a pattern surface of said mask in said projection optical system, to limit a beam of light passing through the Fourier transform plane, which propagates near an optical axis of said projection optical system, without inverting the phase of another portion of said beam of light, which passes through said Fourier transform plane; and a distance varying unit which varies a distance between said object and an image plane of said projection optical system relating to the pattern of said mask, in a direction of the optical axis during an exposure operation with respect to one region on said object.

49. A projection exposure apparatus according to claim 48, wherein said light-shielding member shields a portion of the beam of light without inverting the phase of another portion of said beam of light, which passes through said Fourier transform plane.

50. A projection exposure apparatus according to claim 48, wherein said light-shielding member entirely shields a portion of said beam of light that propagates near said Fourier transform plane.

51. A projection exposure apparatus according to claim 48, wherein said light-shielding member comprises metal.

52. An exposure method which exposes a pattern of a mask onto an object by a projection optical system, comprising:

placing said mask on an object plane side of said projection optical system, the pattern having a transparent portion which is substantially transparent to exposure light, and a phase shift portion which produces light whose phase is shifted from that of light transmitted through the transparent portion by substantially an odd number multiple of $\pi$;

shielding a light beam passing through a Fourier transform plane, which propagates near an optical axis of said projection optical system, without inverting the phase of another portion of said beam of light, by a light-shielding member which is located substantially at the Fourier transform plane, said Fourier transform plane having an optical Fourier transform relationship with a pattern surface of said mask in said projection optical system; and continuously varying a distance between said object and an image plane of said projection optical system relating to the pattern of said mask, in a direction of the optical axis during an exposure operation with respect to one region on said object.

53. An exposure method according to claim 52, wherein said light-shielding member shields a portion of the beam of light without inverting the phase of another portion of said beam of light, which passes through said Fourier transform plane.

54. An exposure method according to claim 52, wherein said pattern comprises a hole pattern.

55. An object on which a pattern has been transferred by the method according to claim 52.

* * * * *